US009953969B2

(12) United States Patent
Hsieh (10) Patent No.: US 9,953,969 B2
(45) Date of Patent: Apr. 24, 2018

(54) SEMICONDUCTOR POWER DEVICE HAVING SHIELDED GATE STRUCTURE AND ESD CLAMP DIODE MANUFACTURED WITH LESS MASK PROCESS

(71) Applicant: Force Mos Technology Co., Ltd., New Taipei (TW)

(72) Inventor: Fu-Yuan Hsieh, New Taipei (TW)

(73) Assignee: FORCE MOS TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 15/080,639

(22) Filed: Mar. 25, 2016

(65) Prior Publication Data

US 2017/0278837 A1    Sep. 28, 2017

(51) Int. Cl.
  *H01L 29/66*  (2006.01)
  *H01L 27/02*  (2006.01)
  *H01L 29/40*  (2006.01)
  *H01L 29/78*  (2006.01)
  *H01L 23/535* (2006.01)
  *H01L 23/532* (2006.01)

(52) U.S. Cl.
  CPC ........ *H01L 27/0255* (2013.01); *H01L 23/535* (2013.01); *H01L 23/53266* (2013.01); *H01L 29/407* (2013.01); *H01L 29/66734* (2013.01); *H01L 29/7805* (2013.01); *H01L 29/7808* (2013.01); *H01L 29/7813* (2013.01)

(58) Field of Classification Search
  CPC ........ H01L 29/78; H01L 21/28; H01L 27/088
  See application file for complete search history.

(56) References Cited

U.S. PATENT DOCUMENTS

| 2009/0212321 A1* | 8/2009 | Hsieh | H01L 27/0255 257/139 |
| 2010/0123193 A1* | 5/2010 | Burke | H01L 21/82348 257/334 |
| 2011/0291186 A1* | 12/2011 | Yilmaz | H01L 29/4236 257/334 |
| 2013/0092976 A1* | 4/2013 | Hsieh | H01L 27/0629 257/133 |

* cited by examiner

*Primary Examiner* — Charles Garber
*Assistant Examiner* — Abdulfattah Mustapha
(74) *Attorney, Agent, or Firm* — Bacon & Thomas, PLLC (57) ABSTRACT

A semiconductor power device having shielded gate structure in an active area and having ESD clamp diode with two poly-silicon layer process is disclosed, wherein: the shielded gate structure comprises a first poly-silicon layer to serve as a shielded electrode and a second poly-silicon layer to serve as a gate electrode, and the ESD clamp diode formed between two protruding electrodes is also formed by the first poly-silicon layer. A mask specially used to define the ESD clamp diode portion is saved.

12 Claims, 14 Drawing Sheets

SEMICONDUCTOR POWER DEVICE HAVING SHIELDED GATE STRUCTURE AND ESD CLAMP DIODE MANUFACTURED WITH LESS MASK PROCESS

FIELD OF THE INVENTION

This invention relates generally to the cell structure, device configuration and fabrication process of semiconductor power device. More particularly, this invention relates to an improved cell configuration and manufacturing method to make a semiconductor power device having shielded gate structure and ESD (electronic static discharge) clamp diode with two poly-silicon layers process.

BACKGROUND OF THE INVENTION

Figure 1A:
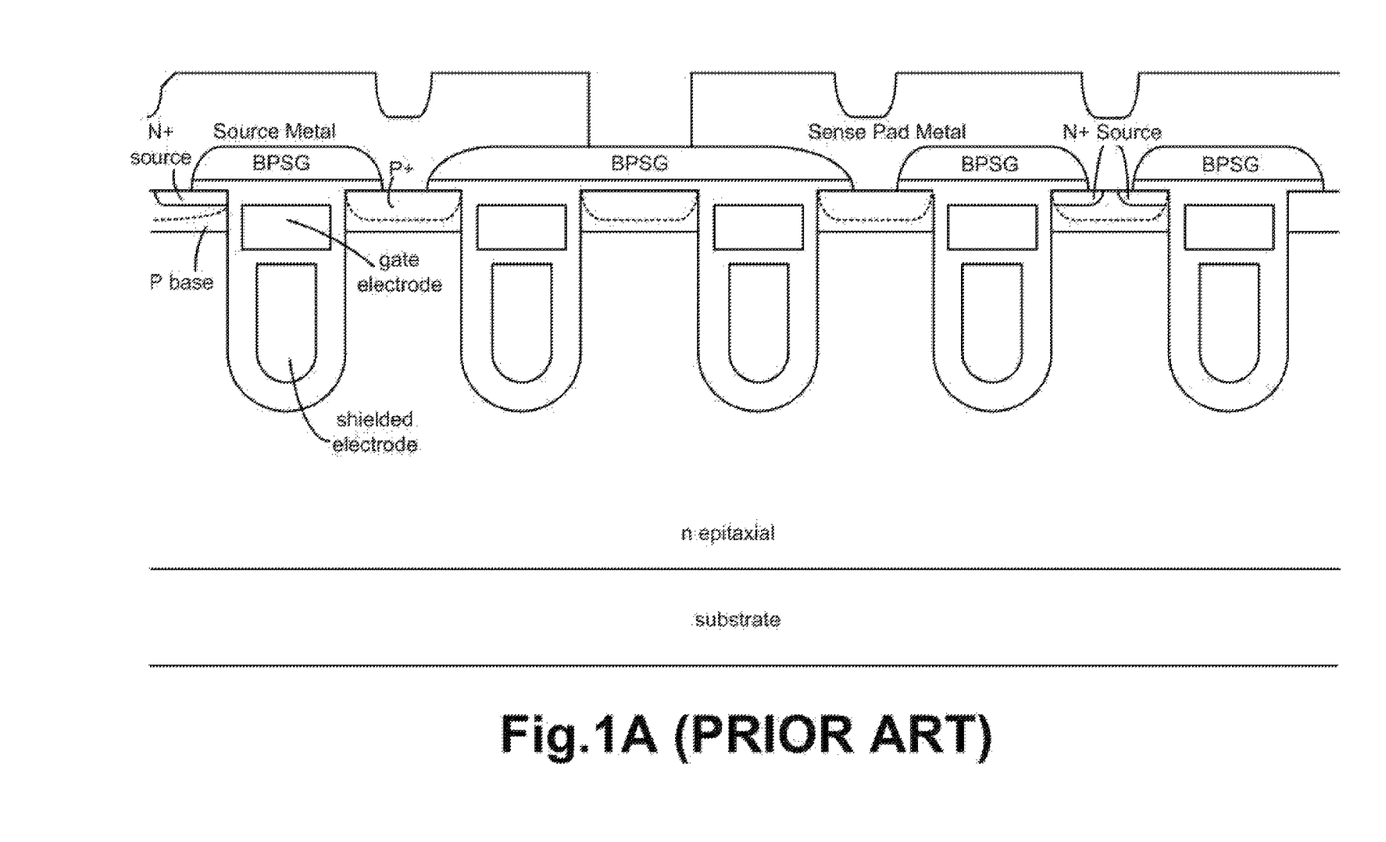
FIG. 1A is a cross-sectional view of a trench MOSFET having shielded gate structure of a prior art.
Figure 1B:
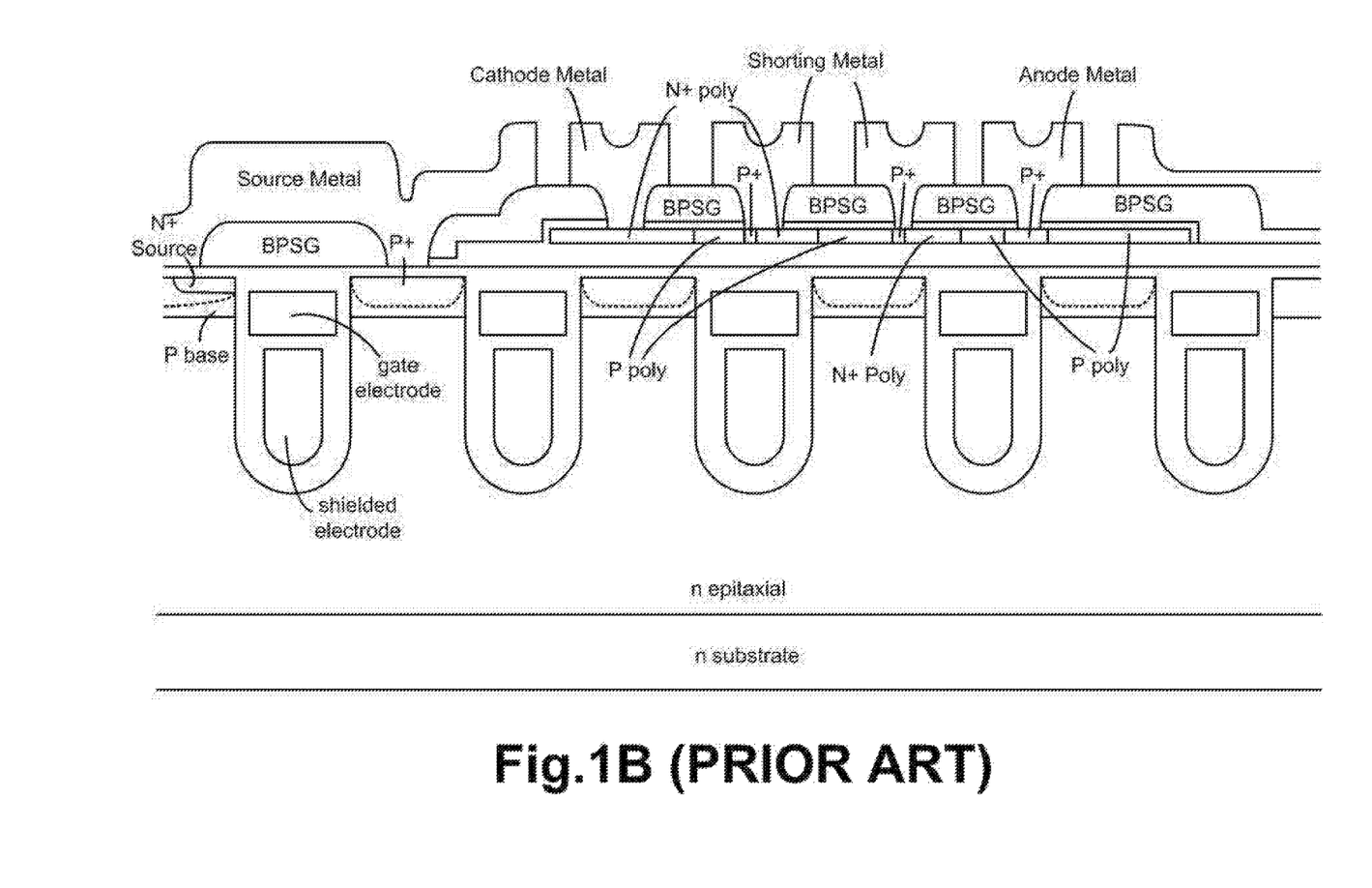
FIG. 1B is a cross-sectional view of a trench MOSFET having shielded gate structure and ESD clamp diode of the same prior art.

For a semiconductor power device including, for example, the MOSFET (Metal Oxide Semiconductor Field Effect Transistor), the IGBT (Insulated-Gate Bipolar transistor), and other various types of transistors, it is becoming more and more important to optimize its performance characteristics such as Cgd (capacitance between gate and drain) and breakdown voltage. For example, compared with a trench MOSFET having trenched gates conventionally comprising a single electrode in an active area, a trench MOSFET having shielded gate structure in the active area (as disclosed in prior art of U.S. Pat. No. 7,855,415 shown in FIG. 1A) is more attractive due to its increased breakdown voltage as well as its reduced Cgd in accordance with its reduced charges between gate and drain, making an excellent choice for power switching applications such as inverters and DC to DC power supply circuits. As illustrated in FIG. 1A, the shielded gate structure comprises a shielded electrode in a lower portion and a gate electrode in an upper portion. Furthermore, in order to enhance capability of ESD protection, an ESD clamp diode comprising multiple alternatively arranged n+ doped region and p doped region is usually integrated with a semiconductor power device for example a trench MOSFET having shielded gate structure as discussed above. FIG. 1B shows a semiconductor power device having shielded gate structure and ESD clamp diode disclosed in the same prior art as FIG. 1A where three poly-silicon layers are required in manufacturing process respectively for: the shielded electrode, the gate electrode and the ESD clamp diode, at the same time, according to the prior art, another two masks are needed to respectively define the area for the trenched gates having shielded gate structure and for the ESD clamp diode. However, when it is more and more important to reduce the manufacturing cost for semiconductor power devices, all the poly-silicon layers and the masks needed in the prior art are not cost effective for mass production.

Therefore, there is still a need in the art of the semiconductor power device design and fabrication, particular for the semiconductor power device having shielded gate structure integrated and an ESD clamp diode, to provide a novel cell structure, device configuration and fabrication process that would further reduce the number of masks and poly-silicon layers applied in the manufacturing process for cost reduction without sacrificing any performance of the semiconductor power device.

SUMMARY OF THE INVENTION

It is therefore an aspect of the present invention to provide a semiconductor power device having shielded gate structure in an active area and having an ESD clamp diode so that the stability performance of the semiconductor power device can be improved while the number of masks and poly-silicon layers used for making the semiconductor power device can be reduced for cost reduction and for manufacturing process simplification. Therefore, according to the present invention, there is provided a semiconductor power device comprising: an epitaxial layer of a first conductivity type extending over a substrate; a plurality of first type trenches formed in the epitaxial layer in an active area, each of the first type trenches being filled with a shielded gate structure comprising a first poly-silicon layer in a lower portion to serve as a shielded electrode and a second poly-silicon layer in an upper portion to serve as a gate electrode, wherein the shielded electrode is insulated from the epitaxial layer by a first insulating film and the gate electrode is insulated from the epitaxial layer by a gate insulating film which has a thickness less than the first insulating film, wherein the shielded electrode and the gate electrode are insulated from each other by a second insulating film; an ESD clamp diode formed by at least two protruding electrodes which are formed in at least two adjacent second type trenches in the epitaxial layer and are extending to connect each other onto a top surface of the epitaxial layer, wherein the protruding electrodes are formed by the first poly-silicon layer and insulated from the epitaxial layer by the first insulating film.

Therefore, by employing the inventive semiconductor power device, only two poly-silicon layers are required in manufacturing process: the first poly-silicon layer for the shielded electrode and for the ESD clamp diode; the second poly-silicon layer for the gate electrode. One poly-silicon layer is saved comparing with the prior art. Meanwhile, the mask specially used to define the area for the ESD clamp diode in the prior art is also saved in the present invention because that the mask used to define the area for the first type trenches filled with the shielded gate structure can be also used to define the area for the ESD clamp diode when manufacturing the semiconductor power device of the present invention. Thus, the goal for cost reduction and manufacturing process simplification is achieved. On the other hand, the aforementioned shortage issue may happened in the prior art will never happen in the present invention because that each of the second type trenches is located right below a trenched ESD contact which is used to connect the ESD clamp diode between a source metal and a gate metal and can only extending into one of the second type trenches if the ESD clamp diode is over-etched, therefore preventing the shortage issue from happening. Thus, the other goal for improving the stability performance of the semiconductor power device is also achieved.

According to another aspect of the present invention, the ESD clamp diode comprises at least one pair of back to back Zener diodes in such a manner that anode regions of each pair of back to back Zener diodes are connected together, a cathode region of the Zener diodes is shorted to a source metal of the semiconductor power device, and another cathode region of the Zener diodes is shorted to a gate metal of the semiconductor power device. Conversely, the ESD clamp diode comprising at least one pair of back to back Zener diodes also can be implemented in such a manner that cathode regions of each pair of back to back Zener diodes are connected together, an anode region of the Zener diodes is shorted to a source metal of the semiconductor power device, and another anode region of the Zener diodes is shorted to a gate metal of the semiconductor power device.

According to another aspect of the present invention, the source metal of the semiconductor power device is further connected to a source region and a body region in the active area through a trenched source-body contact filled with the contact metal plug, and is also connected to the shielded electrode by shorting to an outlet part for the shielded electrode through a trenched shielded electrode contact filled with the contact metal plug, wherein the outlet part for the shielded electrode is also formed by the first poly-silicon layer and filled in a third type trench. Simultaneously, the gate metal of the semiconductor power device if further connected the gate electrode by shorting to a wide gate electrode through a trenched gate contact filled with the contact metal plug, wherein the wide gate electrode is formed in a fourth type trench which is filled with a same shielded gate structure as the first type trenches but having a greater trench width.

According to another aspect of the present invention, the shielded electrode in each of the first type trenches has a second conductivity type, for example, has a p conductivity type in an N-channel semiconductor power device, to improve the electric field distribution in the epitaxial layer near the shielded electrode. Furthermore, in some preferred embodiment, a top portion of the shielded electrode can be further doped so as to have a higher doping concentration than a bottom portion of the shielded electrode to enhance the contact performance with the outlet part for the shielded electrode.

According to another aspect of the present invention, in some preferred embodiment, the contact metal plug is Al alloys or Cu padded by a resistance-reduction layer of Ti or Ti/TiN, which is further extending onto the contact interlayer for formation of the source metal and the gate metal. In some other preferred embodiment, the contact metal plug is implemented by using a tungsten metal layer padded by a barrier metal layer of Ti/TiN or Ta/TiN or Co/TiN.

It is therefore another aspect of the present invention to provide a method of manufacturing a semiconductor power device, comprising: applying a trench mask onto an epitaxial layer of a first conductivity type formed onto a substrate heavily doped with the first conductivity type; etching a plurality of first type trenches in an active area and at least two adjacent second type trenches in an ESD clamp diode area in the epitaxial layer; forming a first insulating film lining inner surfaces of the first and second type trenches as well as onto a top surface of the epitaxial layer; depositing a first poly-silicon layer onto the first insulating film to fill the first and second type trenches till having a certain thickness onto the epitaxial layer; applying a shielded gate mask onto the first poly-silicon layer; removing the first poly-silicon layer away from an upper portion of each of the first type trenches to form shielded electrode while keeping necessary portion onto the second type trenches for formation of an ESD clamp diode; removing the first insulating film away from the upper portion of each of the first type trenches; forming a second insulating film covering a top surface of the shielded electrode and forming a gate insulating film along inner surface of each of the first type trenches above the shielded electrode; depositing a second poly-silicon layer to fill the upper portion of each of the first type trenches and close to the gate insulating film to form gate electrode. In some preferred embodiment, before applying the shielded gate mask, a blank ion implantation with dopants of a second conductivity type is carried out to make the first poly-silicon layer have a second conductivity type. More preferred, before etching away the first insulating film, another blank ion implantation with dopants of the second conductivity type is carried out to make a top surface of the shielded electrode have a higher doping concentration than the rest part thereunder.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE EMBODIMENTS

In the following Detailed Description, reference is made to the accompanying drawings, which forms a part thereof, and in which is shown by way of illustration specific embodiments in which the invention may be practiced. In this regard, directional terminology, such as "top", "bottom", "front", "back", etc., is used with reference to the orientation of the Figure(s) being described. Because components of embodiments can be positioned in a number of different orientations, the directional terminology is used for purpose of illustration and is in no way limiting. It is to be understood that other embodiments may be utilized and structural or logical changes may be make without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 2A:
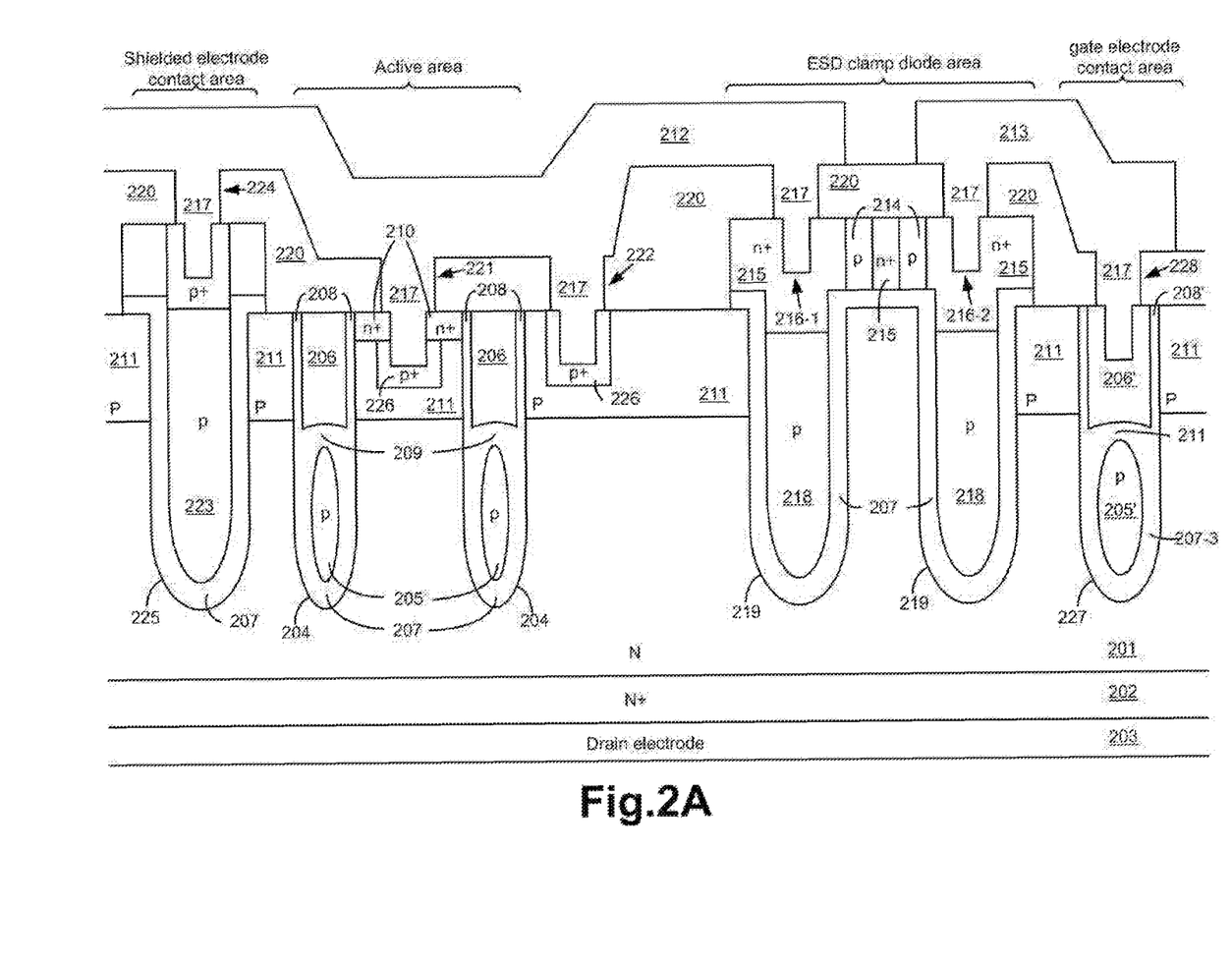
FIG. 2A is a cross-sectional view of a preferred embodiment according to the present invention.

Please refer to FIG. 2A for a preferred embodiment of this invention comprising an N-channel trench MOSFET integrated with ESD clamp diode. In FIG. 2A, the N-channel trench MOSFET is formed in an N epitaxial layer 201 above a heavily doped N+ substrate 202 coated with a back metal layer of Ti/Ni/Ag on a rear side as a drain electrode 203. In an active area of the N-channel trench MOSFET, a plurality of first type trenches 204 are formed each filled with a shielded gate structure comprising a p type (the opposite conductivity type to the n type) shielded electrode 205 in a lower portion and an n+ gate electrode 206 in an upper portion, wherein the shielded electrode 205 is insulated from the N epitaxial layer 201 by a first insulating film 207, the gate electrode 206 is insulated from the N epitaxial layer 201 by a gate insulating film 208 which has a less thickness than the first insulating film 207. Meanwhile, the shielded electrode 205 and the gate electrode 206 are insulated from each other by a second insulating film 209. According to the present invention, the shielded electrode 205 is formed by a first poly-silicon layer and the gate electrode 206 is formed by a second poly-silicon layer. The active area further comprises an n+ source region 210 encompassed in a P body region 211 flanking the gate electrode 206. In an ESD clamp diode area, an ESD clamp diode is connected between a source metal 212 and a gate metal 213 for ESD protection, wherein the ESD clamp diode comprises multiple alternatively arranged n+ doped regions and p doped regions, constituting at least one pair (there are two pairs in this embodiment) of back to back Zener diodes in such a manner that anode regions 214 (the p doped regions) of each pair of back to back Zener diodes are connected together, a cathode region (one of the n+ doped regions) 215 of the Zener diodes is shorted to the source metal 212 through a trenched ESD contact 216-1 filled with a contact metal plug 217, and another cathode region 215 of the Zener diodes is shorted to the gate metal 213 through another trenched ESD contact 216-2 filled with the contact metal plug 217. According to the present invention, the ESD clamp diode is formed by at least two protruding electrodes 218 connected to each other onto a top surface of the N epitaxial layer 201, wherein the protruding electrodes 218 formed by the same first poly-silicon layer as the shielded electrode 205 are formed in at least two adjacent second type trenches 219 without having the P body region therebetween and are also insulated from the N epitaxial layer 201 by the first insulating film 207. What should be noticed is that, each the trenched ESD contact 216-1 or 216-2 is located right above one of the second type trenches 219, therefore preventing the shortage issue encountered in the prior art from happening because that the trenched ESD contact will extend into the second type trench 219 if the ESD clamp diode is over etched. The source metal 212 overlying a contact interlayer 220 is simultaneously shorted to the n+ source region 210, the P body region 211, and to the shielded electrode 205. Detailed, in the active area, the n+ source region 210 and the P body region 211 are shorted to the source metal 212 through a trenched source-body contact 221 which is also filled with the contact metal plug 217 while penetrating through the contact interlayer 220, the n+ source region 210 and extending into the P body region 211; between the active area and the ESD clamp diode area, the P body region 211 therein is also shorted to the source metal 212 through a trenched body contact 222 which is also filled with the contact metal plug 217 while penetrating through the contact interlayer 220 and extending into the P body region 211 between the active area and the ESD clamp diode area; each the shielded electrode 205 is shorted to the source metal 212 through an outlet part 223 for the shielded electrode which is further connected to the source metal 212 through a trenched shielded electrode contact 224 which is also filled with the contact metal plug 217 while penetrating through the contact interlayer 220 and extending into a top portion of the outlet part 223 for the shielded electrode, wherein the outlet part 223 also formed by the first poly-silicon layer is filled in a third type trench 225 in a shielded electrode contact area and is also insulated from the N epitaxial layer 201 by the first insulating film 207. In order to reduce the contact resistance between the contact metal plug 217 and the silicon layer interfaced therewith, a p+ body ohmic doped region 226 is introduced: surrounding bottom and sidewall of the trenched source-body contact 221 underneath the n+ source region 210; and surrounding bottom and sidewall of the trenched body contact 222 in the P body region 211. In the same fabricating step of forming the p+ body ohmic doped region 226, the top portion of the outlet part 223 for the shielded electrode is also implanted so as to have a higher doping concentration than the rest thereunder for contact resistance reduction. For gate connection of the N-channel trench MOSFET, each the gate electrode 206 is connected to a wider gate electrode 206' in an upper portion of a fourth type trench 227 in a gate electrode contact area, and further shorted to the gate metal 213 through a trenched gate contact 228 which is also filled with the contact metal plug 217 while penetrating through the contact interlayer 220 and extending into the wide gate electrode 206' above a wider shielded electrode 205' in a lower portion of the fourth type trench 227 which has a greater trench width than the first type trenches 204. In this preferred embodiment, the contact metal plug 217 is implemented by depositing corresponding metal layer for source metal or gate metal directly into a plurality of contact holes respectively for the trenched ESD contact 216-1 and 216-2, the trenched source-body contact 221, the trenched body contact 222, the trenched shielded electrode contact 224 and the trenched gate contact 228.

Figure 2B:
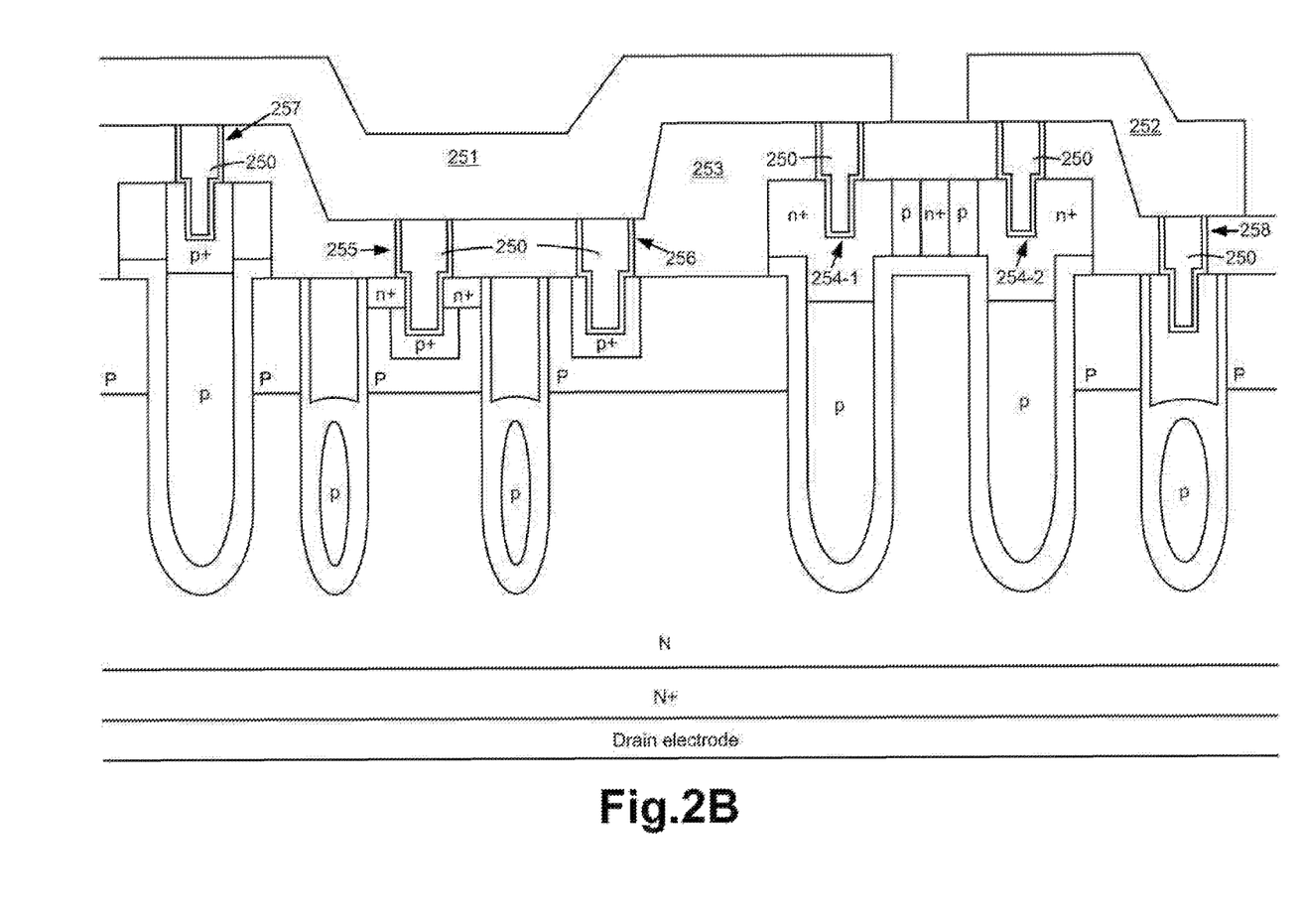
FIG. 2B is a cross-sectional view of another preferred embodiment according to the present invention.

Please refer to FIG. 2B for another preferred embodiment of this invention. The semiconductor power device in FIG. 2B has a similar structure to that in FIG. 2A except that, in FIG. 2B, each contact metal plug 250 is implemented by using a tungsten metal layer padded by a barrier metal layer of Ti/TiN or Ta/TiN or Co/TiN for better contact performance between the contact metal plug and a corresponding metal layer whereon (a source metal 251 or a gate metal 252). Therefore, the source metal 251 is formed overlying a contact interlayer 253 and covering each the contact metal plug 251 comprised in: a trench ESD contact 254-1, a trenched source-body contact 255, a trenched body contact 256, and a trenched shielded electrode contact 257. And, the gate metal 252 is formed overlying the contact interlayer 253 and covering each the contact metal plug 250 comprised in: another trenched ESD contact 254-2 and a trenched gate contact 258.

Figure 3A:
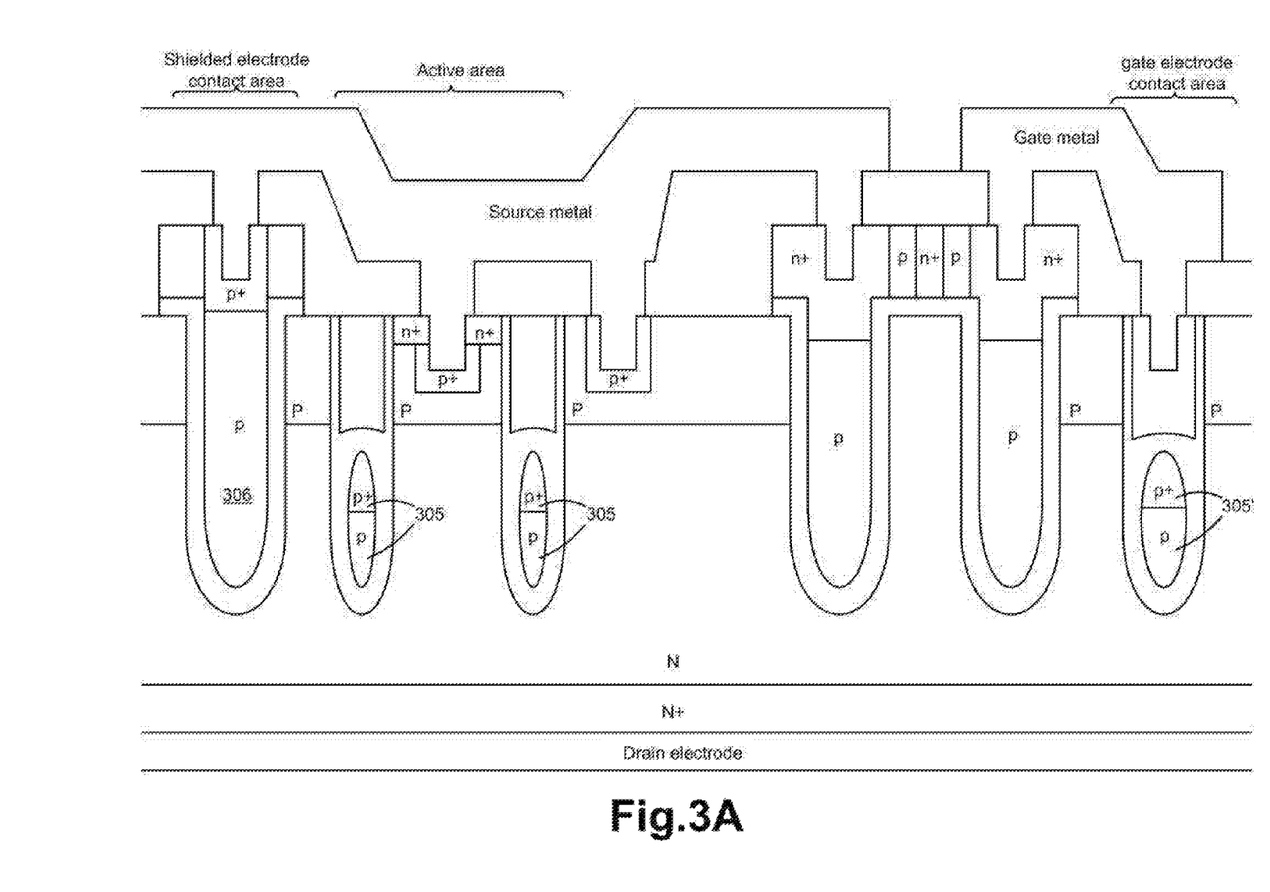
FIG. 3A is a cross-sectional view of another preferred embodiment according to the present invention.

Please refer to FIG. 3A for another preferred embodiment of this invention. The N channel semiconductor power device in FIG. 3A is similar to that in FIG. 2A except that, in FIG. 3A, an extra ion implantation of p type dopant is carried out so that each the shielded electrode 305 in an active area has a top portion having a higher doping concentration than a bottom portion and a wider shielded electrode 305' in a gate electrode contact area has a top portion having a higher doping concentration than a bottom portion, resulting in a better contact performance because all the shielded electrodes (including the wider shielded electrode) are connected together to the an outlet part 306 for the shielded electrode in a shielded electrode contact area.

Figure 3B:
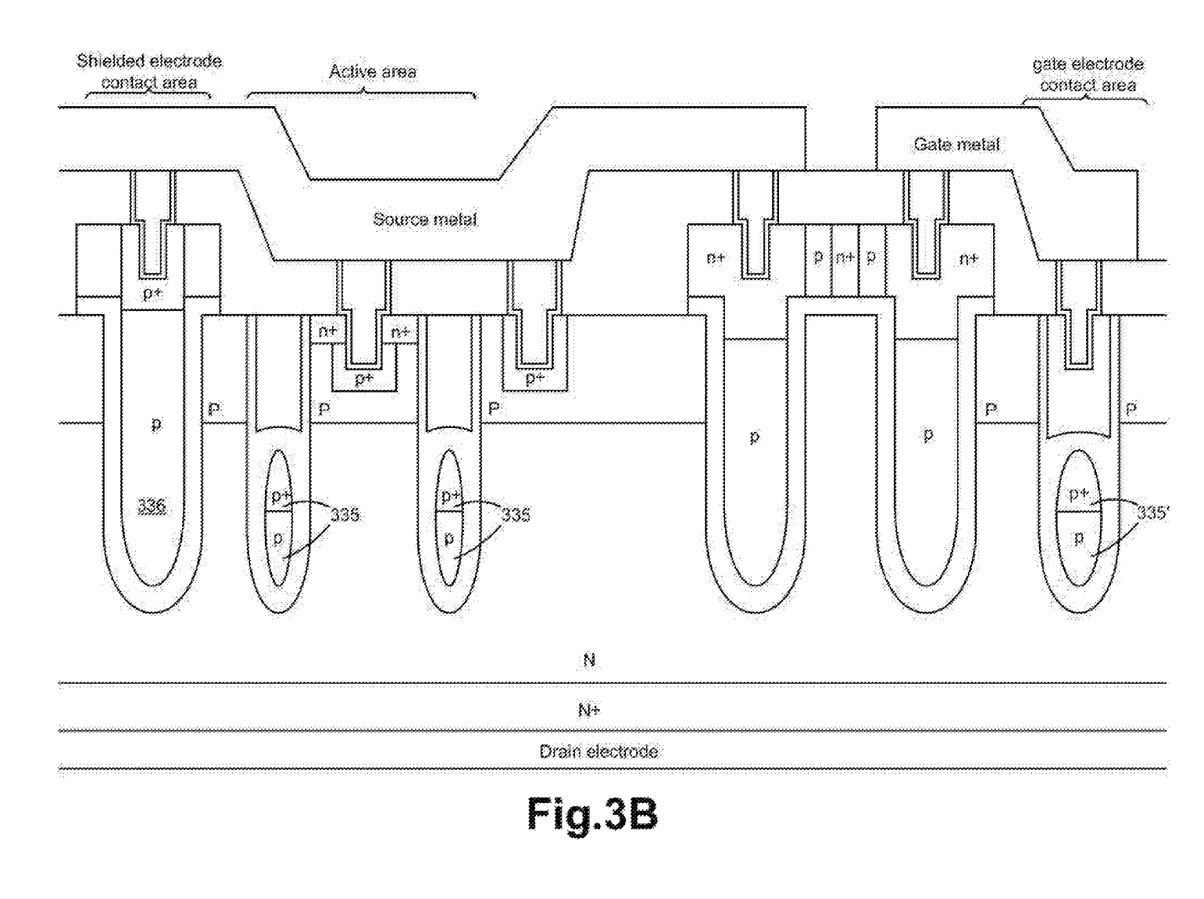
FIG. 3B is a cross-sectional view of another preferred embodiment according to the present invention.

Please refer to FIG. 3B for another preferred embodiment of this invention. The N channel semiconductor power device in FIG. 3B is similar to that in FIG. 2B except that, in FIG. 3B, an extra ion implantation of p type dopant is carried out so that each the shielded electrode 335 in an active area has a top portion having a higher doping concentration than a bottom portion and a wider shielded electrode 335' in a gate electrode contact area has a top portion having a higher doping concentration than a bottom portion, resulting in a better contact performance because all the shielded electrodes (including the wider shielded electrode) are connected together to the an outlet part 336 for the shielded electrode in a shielded electrode contact area.

Figure 4A:
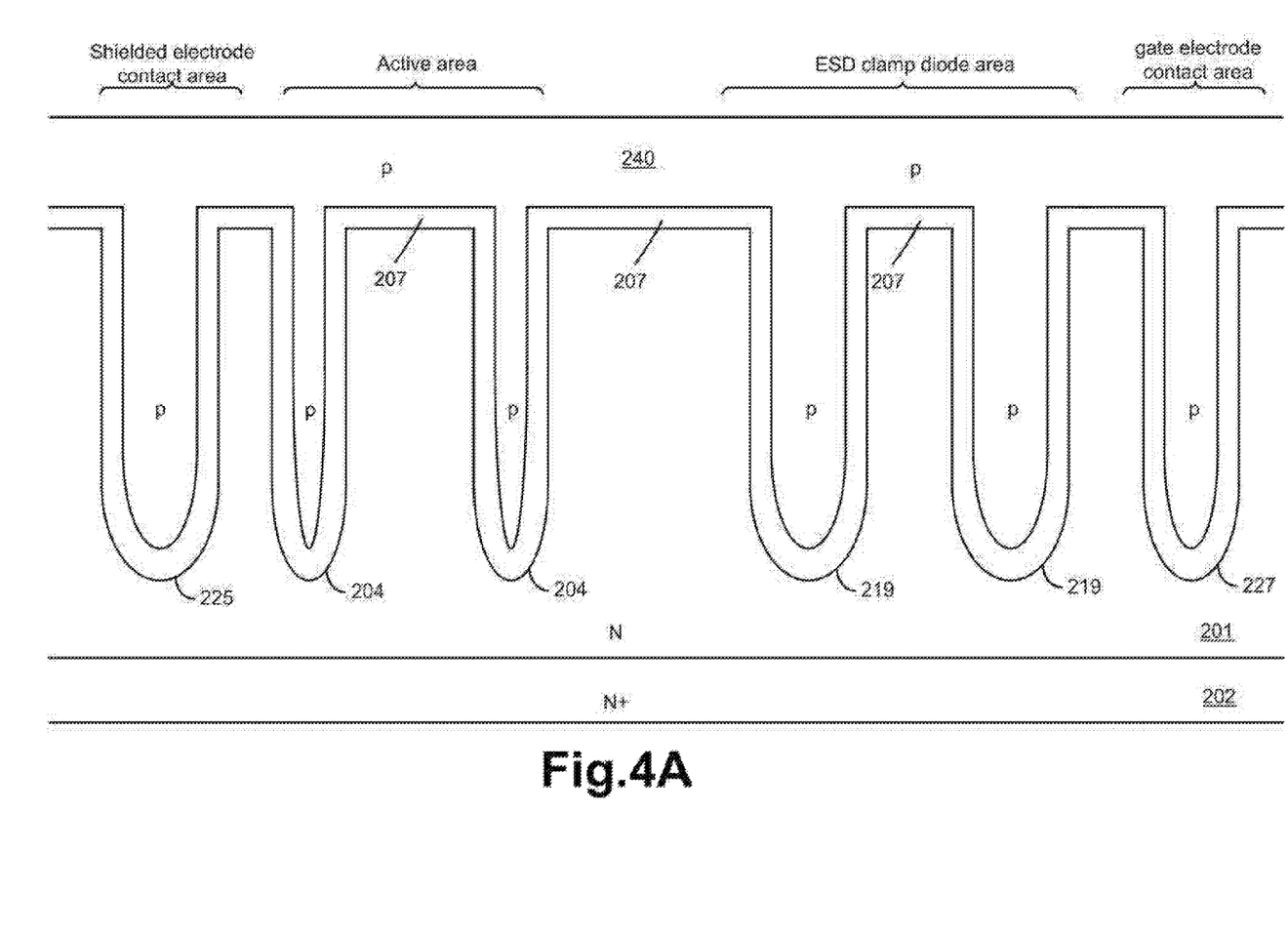
FIGS. 4A to 4G are a serial of side cross-sectional views for showing the process steps for manufacturing a semiconductor power device according to the present invention.

FIGS. 4A to 4G are a serial of side cross-sectional views for showing some process steps for manufacturing a semiconductor power device as shown in FIG. 2A and FIG. 2B according to the present invention. Referring to FIG. 4A, an N epitaxial layer 201 is formed onto a top surface of a heavily doped N+ substrate 202. Next, a trench mask (not shown) is applied onto the N epitaxial layer 201 and followed by a trench etch process to form several types of trenches in the N epitaxial layer 201 to a certain depth, including: a plurality of first type trenches 204 in an active area; at least two adjacent second type trenches 219 in an ESD clamp diode area; a third type trench 225 in a shielded electrode contact area; and a fourth type trench 227 in a gate electrode contact area, wherein the first type trenches 204 in the active area can be implemented to each has a less trench width than the other types of trenches. Then, a sacrificial oxide layer (not shown) is grown and then removed to eliminate the plasma damaged silicon layer introduced during the process of opening those several types of trenches. After that, a first insulating film 207, for example an oxide layer, is deposited onto a top surface of the N epitaxial layer 201 and along inner surface of those several types of trenches. Then, a first poly-silicon layer 240 comprising un-doped poly-silicon is deposited onto the first insulating film 207 to fill into those several types of trenches and cover the top surface of the N epitaxial layer 201. Then, a blank Boron ion implantation process and a drive-in process are successively carried out to make the first poly-silicon layer 240 a P doped poly-silicon layer.

Figure 4B:
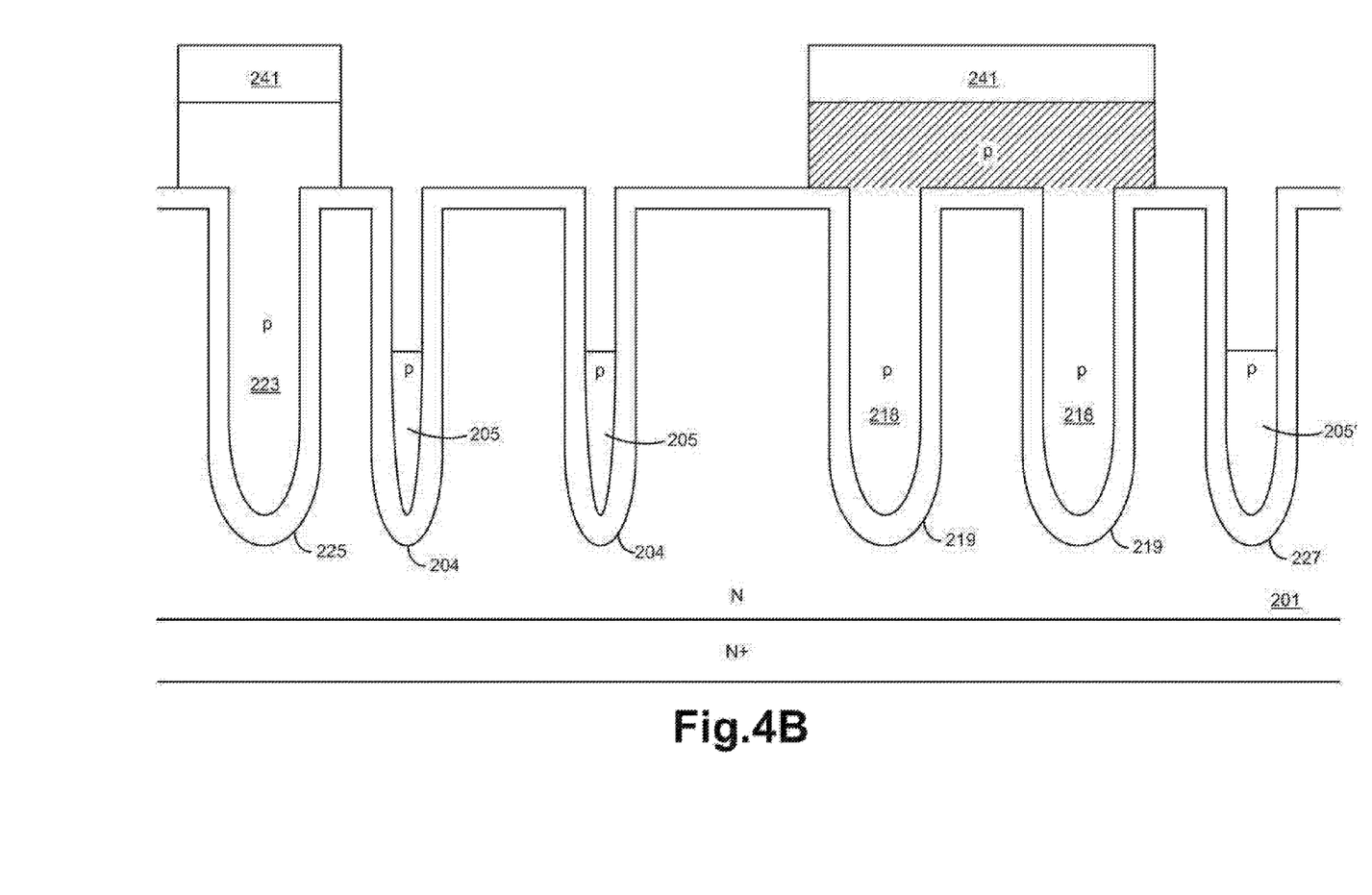

In FIG. 4B, after a shielded gate mask 241 is applied onto the first poly-silicon layer, a dry poly-silicon etch process is carried out to remove the first poly-silicon layer from an upper portion of each of the first type trenches 204, from an upper portion of the fourth type trench 227 as well as from the top surface of the N epitaxial layer 201 not covered by the shielded gate mask 241, while keeping necessary portions of the first poly-silicon layer to respectively act as: a shielded electrode 205 in a lower portion of each of the first type trenches 204, a wider shielded electrode 205' in a lower portion of the fourth type trench 227, at least two protruding electrodes 218 protruding out of the second type trenches 219, and an outlet part 223 protruding out of the third type trench 225. What should be noticed is that, as a result of being covered by the shielded gate mask 241, portions of the protruding electrode 218 higher than the top surface of the N epitaxial layer 201 (as illustrated by the shaded area) are remained connected together for formation of an ESD clamp diode. That is to say, the shielded electrode 205, the protruding electrodes 218, the wider shielded electrode 205' and the outlet part 223 for the shielded electrode are formed by a same first poly-silicon layer and have a same conductivity type, but given different element names just for distinguishing.

Figure 4C:
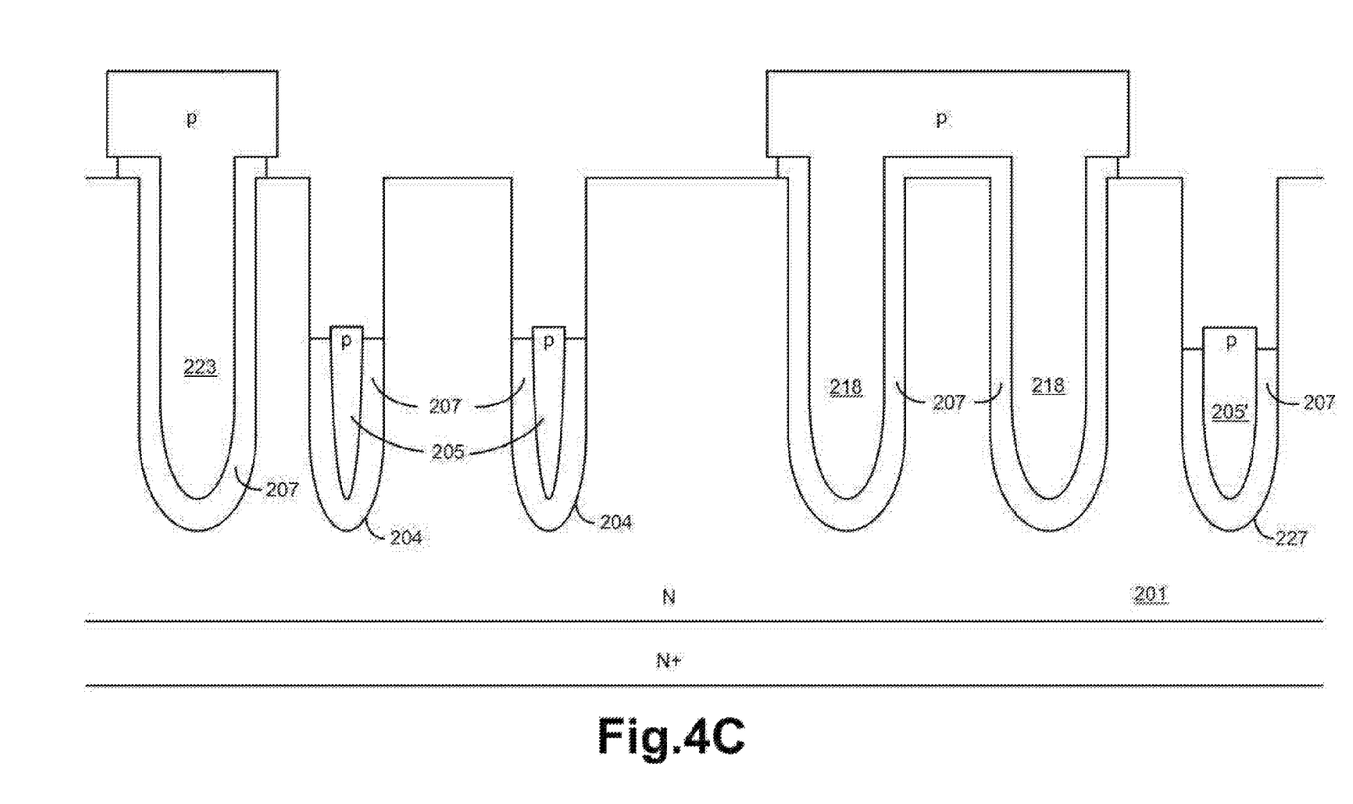

In FIG. 4C, the first insulating film 207 is partially etched away by a wet oxide etch process from the top surface of the N epitaxial layer 201 without having poly-silicon layer whereon, from the inner surface of each of the first type trenches 204 above the shielded electrode 205, and from the inner surface of the fourth type trench 227 above the wider shielded electrode 205'.

Figure 4D:
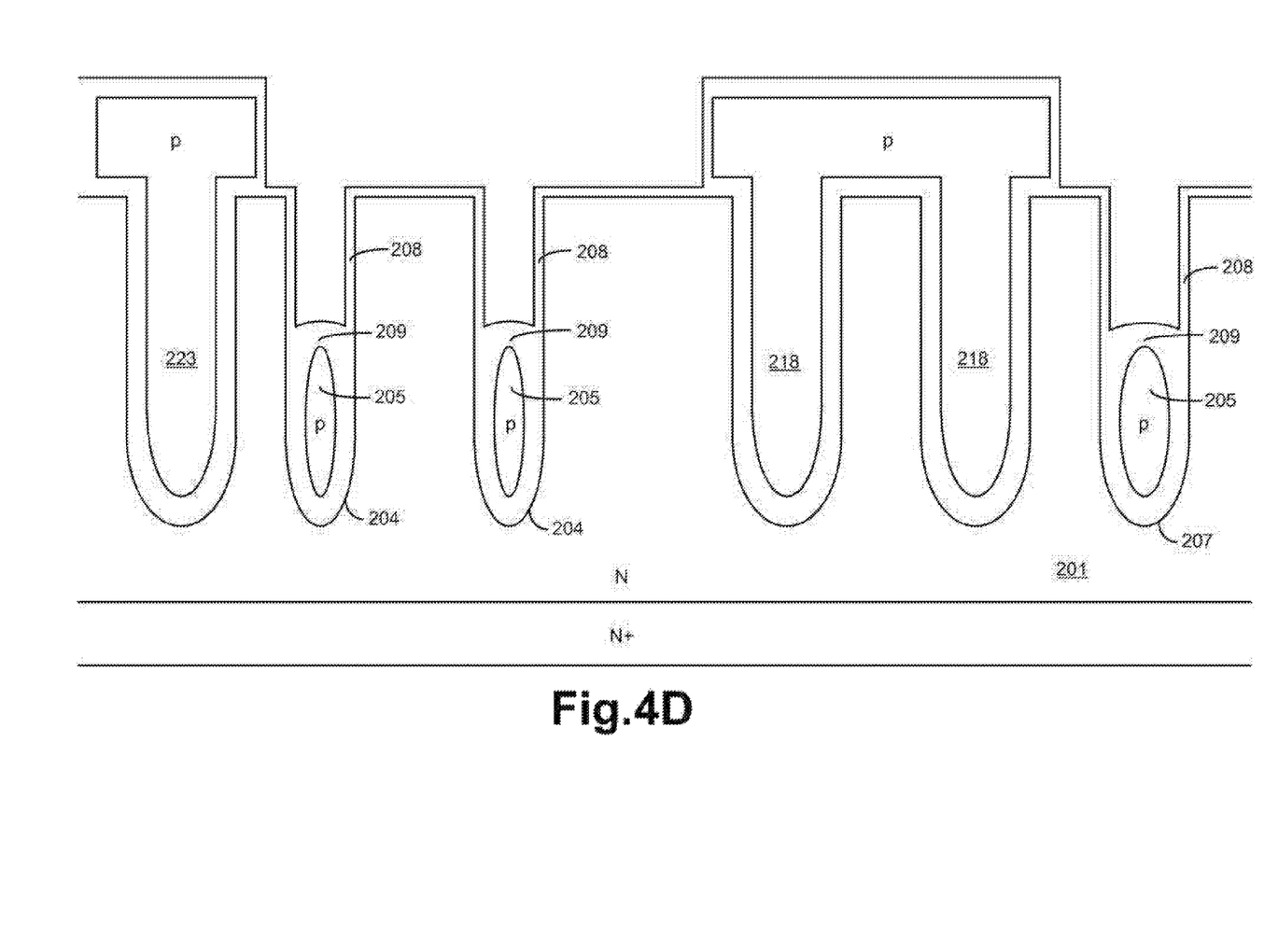

In FIG. 4D, a gate oxidation is performed to form a gate insulating film 208 along the inner surface of each of the first type trenches 204 above the shielded electrode 205, along the inner surface of the fourth type trench 227 above the wider shielded electrode 205', as well as covering the top surface of the N epitaxial layer 201 and an outer surface of the protruding electrodes 218 and the outlet part 223 for the shielded electrode. A second insulating film 209 is respectively formed or grown during the gate oxidation covering top surface of the shielded electrode 205 and the wide shielded electrode 205'.

Figure 4E:
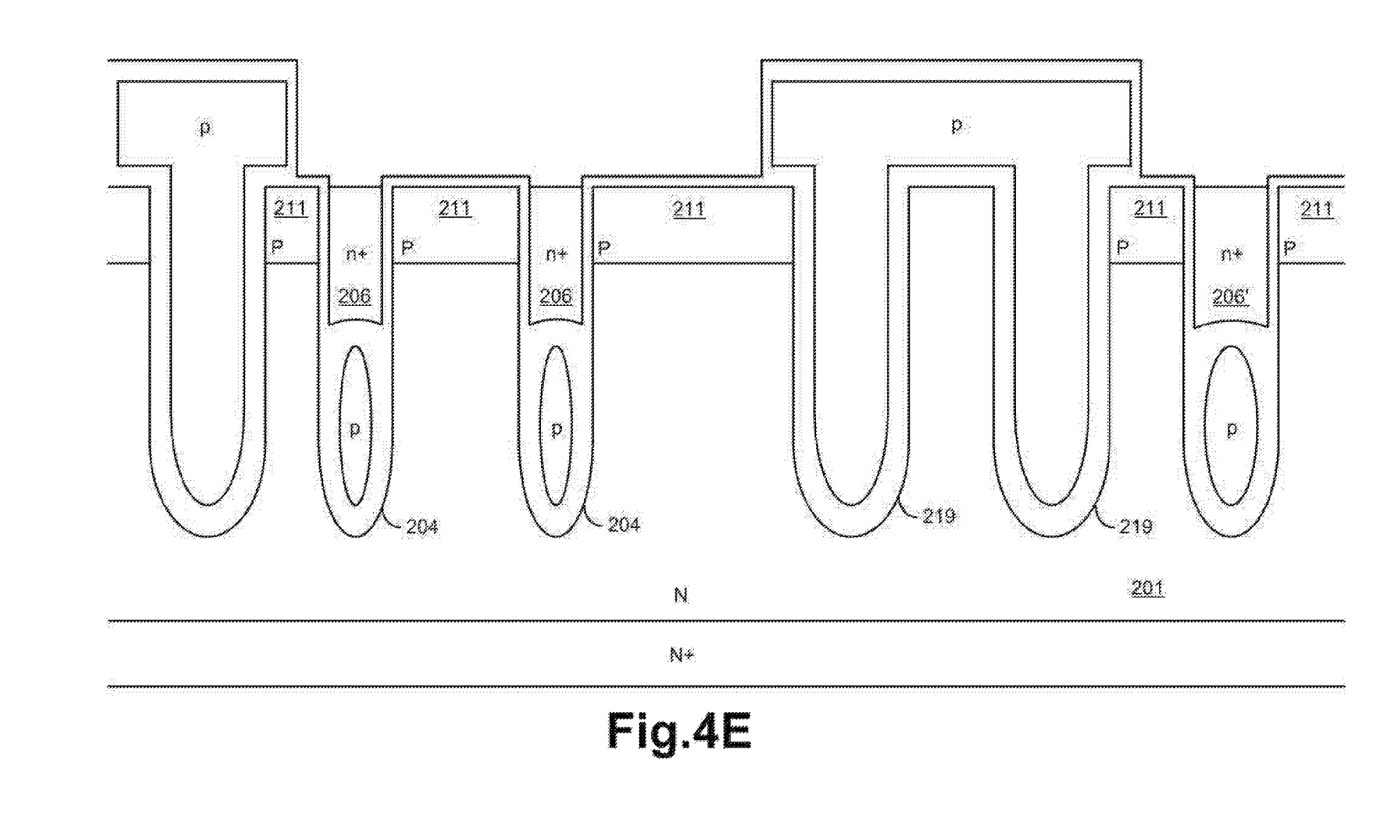

In FIG. 4E, a second poly-silicon layer comprising an n+ doped poly-silicon layer is deposited and then etched back to leave necessary part within the upper portion of each of the first type trenches 204 and the third type trenches 227 to respectively form a gate electrode 208 and a wider gate electrode 208'. Then, a Boron ion implantation is carried out to form a P body region 211 extending in an upper portion of the N epitaxial layer 201 except between the two adjacent second type trenches 219, wherein the P body region 211 has a junction depth no deeper than a bottom surface of the gate electrode 206.

Figure 4F:
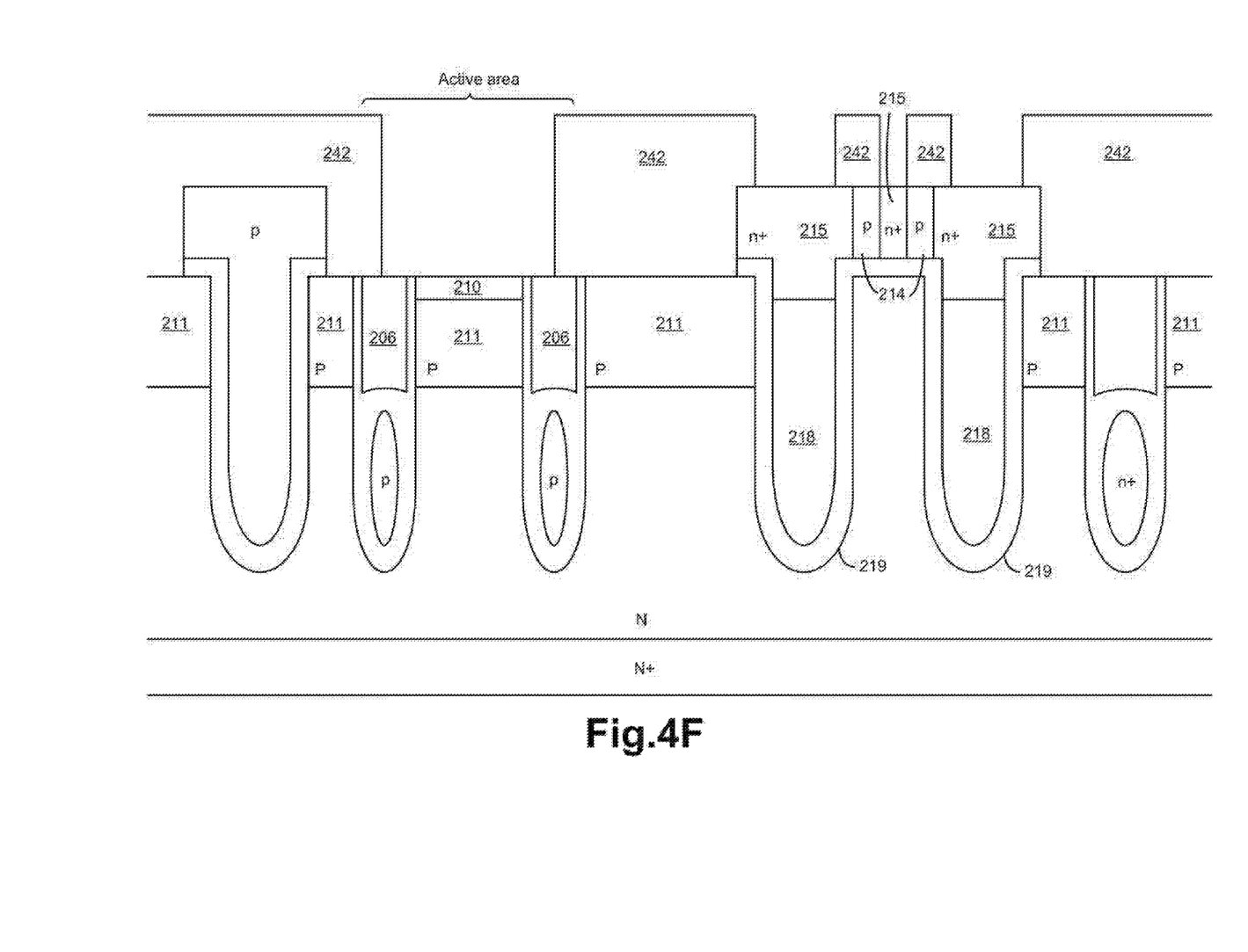

In FIG. 4F, after applying a source mask 242, a source dopant ion implantation followed by source dopant diffusion process is carried out to: form an n+ source region 210 flanking the gate electrode 206 and near a top surface of the P body region 211 in the active area; and to form a plurality of n+ doped regions to serve as cathode regions 215 for Zener diodes comprised in the ESD clamp diode. Therefore, the p doped regions originally doped in FIG. 4A are alternatively sandwiched between the n+ doped regions after the source dopant diffusion to serve as anode regions 214 for the Zener diodes. As illustrated in FIG. 4F, this embodiment takes four Zener diodes as an example to form two pair of back to back Zener diodes sharing a common cathode region 215 (the n+ doped region in the middle portion), wherein the anode regions 214 of each pair are connected together. It is to be understood that an ESD clamp diode in other embodiments may be implemented comprising one pair or more than two pairs of back to back Zener diodes arranged in such a manner. FIG. 4F further indicates that, the source dopant diffusion can only achieve a certain depth for the cathode regions 215, therefore, the rest of the protruding electrodes 218 within the second type trenches 219 are still have a p conductivity type.

Figure 4G:
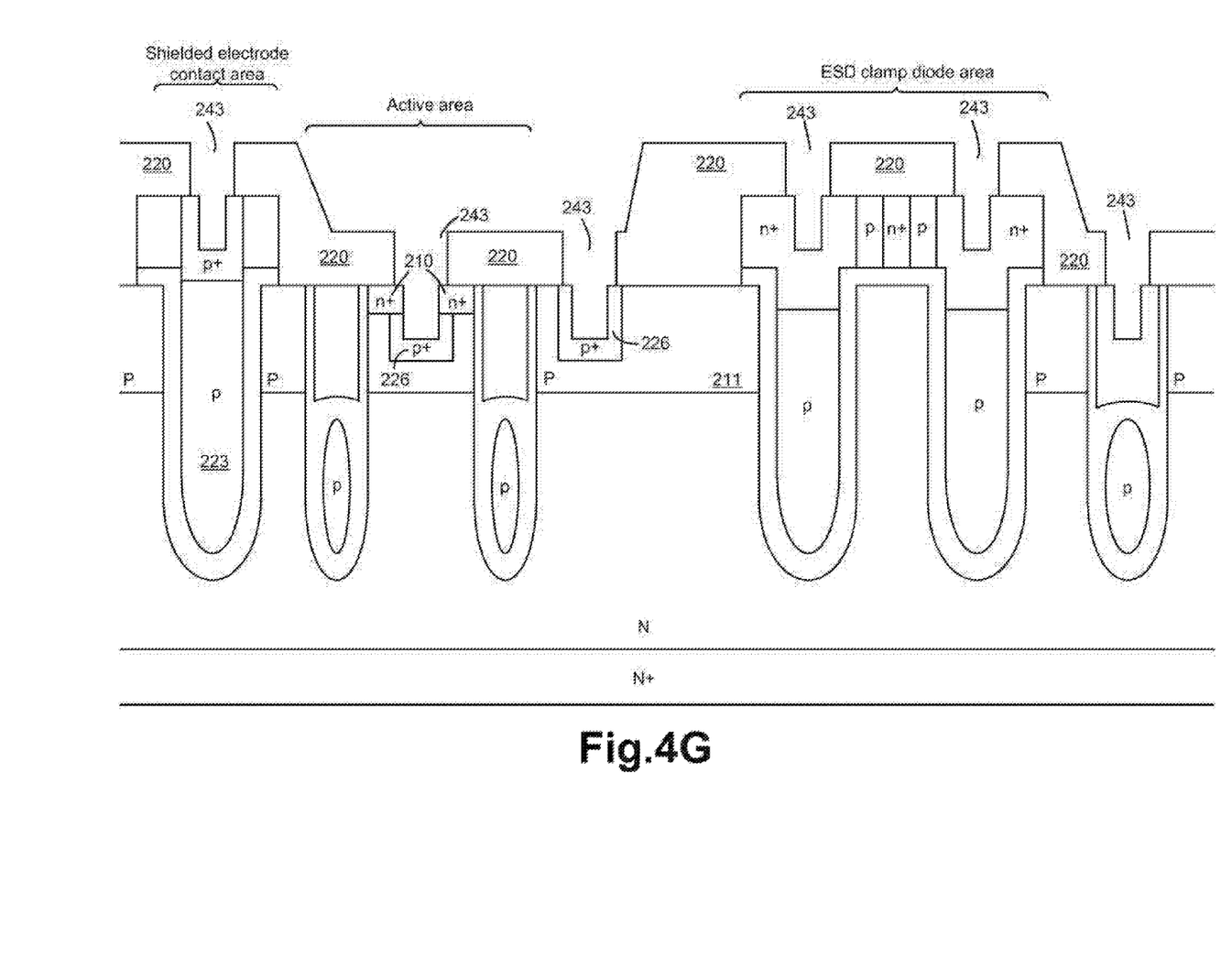

In FIG. 4G, a contact interlayer 220 comprising an insulating film thicker than the first and the second insulating films is deposited on an entire surface of the structure of FIG. 4F. The contact interlayer 220 has a top surface of concave and convex because that the ESD clamp diode and the outlet part 223 for the shielded electrode have top surface higher than the N epitaxial layer 201. Then, a contact mask (not shown) is employed and then followed by successively dry oxide etch and dry silicon etch to open a plurality of contact holes 243 to a certain depth. Next, after carrying out a BF2 ion implantation above the contact holes 243 and a step of RTA (Rapid Thermal Annealing) process, a p+ body ohmic doped region 226 is formed respectively surrounding: bottom and sidewalls of a contact hole 243 in the active area underneath the n+ source region 210; bottom and sidewalls of another contact hole 243 in the P body region 211 between the active area and the ESD clamp diode area. Meanwhile, a top portion of the outlet part 223 for the shielded electrode is also doped through another contact hole 243 in the shielded electrode contact area so as to have a higher doping concentration than the rest thereunder.

Figure 5:
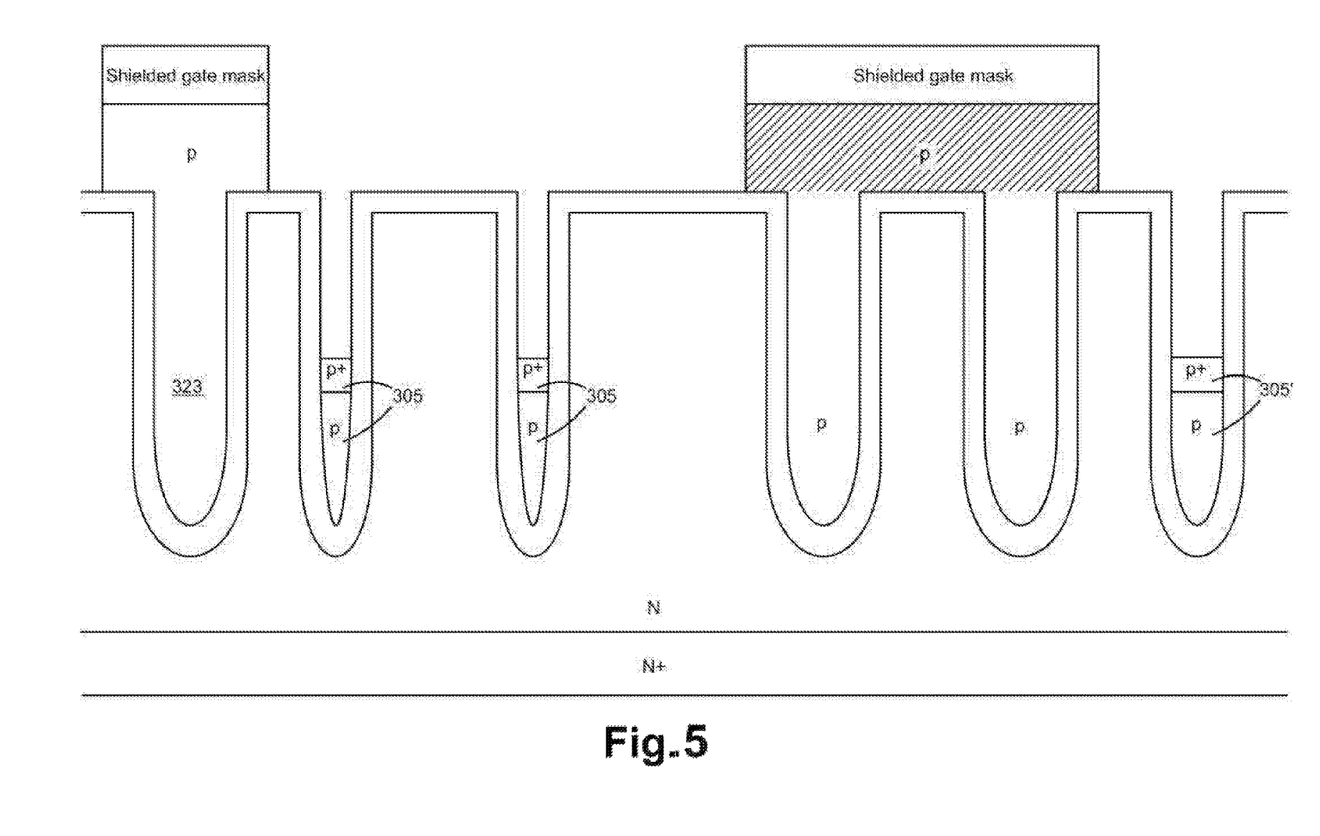
FIG. 5 is a cross-sectional view for showing a process step to form the preferred embodiment as shown in FIG. 3A and FIG. 3B.

FIG. 5 shows a processing step for forming a semiconductor power device in FIG. 3A or FIG. 3B, while other steps are similar to those shown in FIG. 4A~FIG. 4G. After performing the processing step as shown in FIG. 4A and applying the shield mask 241, an extra Boron or BF2 ion implantation and diffusion, and dry poly-silicon etch process are carried out, to further make each of shielded electrodes 305 and wide shielded electrode 305' has a top portion having a higher doping concentration than a bottom portion, enhancing the contact performance when they are connected together to an outlet part 323 for the shielded electrode.

Although the present invention has been described in terms of the presently preferred embodiments, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. A semiconductor power device comprising:
an epitaxial layer of a first conductivity type extending over a substrate;
a plurality of first type trenches formed in said epitaxial layer in an active area, each of said first type trenches being filled with a shielded gate structure comprising a first poly-silicon in a lower portion to serve as a shielded electrode and a second poly-silicon layer in an upper portion to serve as a gate electrode, wherein said shielded electrode is insulated from said epitaxial layer by a first insulating film and said gate electrode is insulated from said epitaxial layer by a gate insulating film which has a thickness less than said first insulating film, wherein said shielded electrode and said gate electrode are insulated from each other by a second insulating film;
an ESD clamp diode formed between two adjacent second type trenches in said epitaxial layer and are extending to connect each other onto a top surface of said epitaxial layer, wherein said protruding electrodes are formed by said first poly-silicon layer and insulated from said epitaxial layer by said first insulating film,
said shielded electrode is doped with a second conductivity type which is opposite to said first conductivity type and said gate electrode is doped with said first conductivity type.

2. The semiconductor power device of claim 1, wherein:
a top portion of said shielded electrode has a higher doping concentration than a bottom portion of said shielded electrode.

3. The semiconductor power device of claim 1, wherein:
said ESD clamp diode is constituted of at least one pair of back to back Zener diodes comprising multiple alternatively arranged doped regions of said first conductivity type and doped regions of said second conductivity type opposite to said first conductivity type.

4. The semiconductor power device of claim 3, wherein:
said doped regions of said first conductivity type serve as cathode regions for said Zener diodes and said doped regions of said second conductivity type serve as anode regions for said Zener diodes.

5. The semiconductor power device of claim 4, wherein:
one of said cathode regions is shorted to a source metal through a trenched ESD contact right above one of said second type trenches and filled with a contact metal plug, another of said cathode regions is shorted to a gate metal through another trenched ESD contact right above another of said second type trenches and filled with said contact metal plug.

6. The semiconductor power device of claim 5, wherein:
said contact metal plug is tungsten metal layer padded by a barrier layer of Ti/TiN or Co/TiN or Ta/TiN.

7. The semiconductor power device of claim 5, wherein:
said contact metal plug is Al alloys or Cu padded by a resistance-reduction layer of Ti or Ti/TiN which is the same metal material as said source metal and said gate metal.

8. The semiconductor power device of claim 1, wherein:
said active area further comprises a source region of said first conductivity type and a body region of a second conductivity type opposite to said first conductivity type, wherein said source region and said body region are connected to a source metal through a trenched source-body contact filled with a contact metal plug.

9. The semiconductor power device of claim 1, wherein:
said shielded electrode is connected to an outlet part for the shielded electrode to further be shorted to a source metal through a trenched shielded electrode contact filled with a contact metal plug, wherein said outlet part for said shielded electrode contact is formed by said first poly-silicon layer in a third type trench.

10. The semiconductor power device of claim 8, wherein:
said outlet part for the shielded electrode is doped with a second conductivity type and has a higher doping concentration in a top portion.

11. The semiconductor power device of claim 1, wherein:
said gate electrode is connected to a wider gate electrode to further be shorted to a gate metal through a trenched gate contact filled with a contact metal plug, wherein said wider gate electrode is formed at a same step as said gate electrode in a fourth type trench having a greater trench width than said first type trenches.

12. A semiconductor power device comprising:
an epitaxial layer of a first conductivity type extending over a substrate;
a plurality of first type trenches formed in said epitaxial layer in an active area, each of said first type trenches being filled with a shielded gate structure comprising a first poly-silicon in a lower portion to serve as a shielded electrode and a second poly-silicon layer in an upper portion to serve as a gate electrode, wherein said shielded electrode is insulated from said epitaxial layer by a first insulating film and said gate electrode is insulated from said epitaxial layer by a gate insulating film which has a thickness less than said first insulating film, wherein said shielded electrode and said gate electrode are insulated from each other by a second insulating film;
an ESD clamp diode formed between two adjacent second type trenches in said epitaxial layer and are extending to connect each other onto a top surface of said epitaxial layer, wherein said electrodes are formed by said first poly-silicon layer and insulated from said epitaxial layer by said first insulating film and wherein each of said second type trenches contain a single electrode,
said shielded electrode is doped with a second conductivity type which is opposite to said first conductivity type and said gate electrode is doped with said first conductivity type.

* * * * *